US 6,667,495 B2

(12) United States Patent
Friedrichs et al.

(10) Patent No.: US 6,667,495 B2
(45) Date of Patent: Dec. 23, 2003

(54) SEMICONDUCTOR CONFIGURATION WITH OHMIC CONTACT-CONNECTION AND METHOD FOR CONTACT-CONNECTING A SEMICONDUCTOR CONFIGURATION

(75) Inventors: Peter Friedrichs, Nürnberg (DE); Dethard Peters, Höchstadt (DE); Reinhold Schörner, Grossenseebach (DE)

(73) Assignee: SciCED Electronics Development GmbH & Co. KG, Erlangen (DE)

( * ) Notice: Subject to any disclaimer, the term of this patent is extended or adjusted under 35 U.S.C. 154(b) by 165 days.

(21) Appl. No.: 09/732,989

(22) Filed: Dec. 8, 2000

(65) Prior Publication Data

US 2001/0001484 A1 May 24, 2001

Related U.S. Application Data

(63) Continuation of application No. PCT/DE99/01659, filed on Jun. 7, 1999.

(30) Foreign Application Priority Data

Jun. 8, 1998 (DE) .......................................... 198 25 519

(51) Int. Cl.[7] .......................................... H01L 31/0312
(52) U.S. Cl. ........................... 257/77; 438/105; 438/931
(58) Field of Search ...................... 257/77, 750, 96–97, 257/103, 78, 81; 438/571–573, 931, 105

(56) References Cited

U.S. PATENT DOCUMENTS

| | | | | |
|---|---|---|---|---|
| 3,662,458 A | * | 5/1972 | Formigoni et al. | ......... 216/103 |
| 3,982,262 A | * | 9/1976 | Karatsjuba et al. | ......... 257/101 |
| 4,320,251 A | * | 3/1982 | Narasimhan et al. | ........ 136/255 |
| 4,918,497 A | * | 4/1990 | Edmond | ....................... 257/77 |
| 5,027,168 A | * | 6/1991 | Edmond | ....................... 257/103 |
| 5,124,779 A | | 6/1992 | Furukawa et al. | |
| 5,264,713 A | * | 11/1993 | Palmour | ....................... 257/77 |
| 5,281,831 A | * | 1/1994 | Uemoto et al. | ............. 257/102 |
| 5,449,925 A | * | 9/1995 | Baliga et al. | ................ 257/489 |
| 5,465,249 A | * | 11/1995 | Cooper et al. | ................ 257/77 |
| 5,523,589 A | * | 6/1996 | Edmond et al. | ............. 257/103 |
| 5,539,217 A | * | 7/1996 | Edmond et al. | ............. 257/417 |
| 5,789,311 A | * | 8/1998 | Ueno et al. | ............ 257/E29.104 |
| 5,929,523 A | * | 7/1999 | Parsons | ....................... 257/750 |
| 6,011,278 A | * | 1/2000 | Alok et al. | ................. 257/493 |
| 6,180,958 B1 | * | 1/2001 | Cooper, Jr. | .................... 257/329 |

OTHER PUBLICATIONS

Published International Application No. WO 95/24055 (Mitlehner et al.), dated Sep. 8, 1995.
"Ohmic contacts to SiC" (Harris et al.), dated 1995, Properties of Silicon Carbide, INSPEC, pp. 231–234, as mentioned on p. 2 of the specification.
"Ohmic contacts to p–type 6H–silicon carbide" (Nennewitz et al.), dated Apr. 21, 1995, pp. 347–351.

(List continued on next page.)

Primary Examiner—Long Pham
Assistant Examiner—Thao X. Le
(74) Attorney, Agent, or Firm—Laurence A. Greenberg; Werner H. Stemer; Ralph E. Locher

(57) ABSTRACT

A semiconductor configuration with ohmic contact-connection includes a first and a second semiconductor region made of silicon carbide, each having a different conduction type. A first and a second contact region serve for contact-connection. The first contact region and the second contact region have an at least approximately identical material composition which is practically homogeneous within the respective contact region. A method is provided for contact-connecting n-conducting and p-conducting silicon carbide, in each case with at least approximately identical material.

21 Claims, 3 Drawing Sheets

OTHER PUBLICATIONS

"Interfacial reactions and ohmic contact formation in the Ni/Al–6H SiC system", (Ts. Marinova), dated Sep./Oct. 1996, American Vacuum Society, pp. 3252–3256.

"A critical review of ohmic and rectifying contacts for silicon carbide" (Lisa M. Porter et al.), dated May 10, 1995, pp. 83–105.

"Low resistivity (~ $10^{-5}$ $\Omega$ cm$^2$) ohmic contacts to 6H silicon carbide fabricated using cubic silicon carbide contact layer" (V.A. Dmitriev et al.), dated Jan. 1994, Applied Physics Letters, No. 3, Woodbury, NY,.

"Thermally Stable Low Ohmic Contacts to p–type 6H–SiC Using Cobalt Silicides", (Lundberg et al.), dated Apr. 4, 1996, Solid State Electronics, vol. 39, No. 11, pp. 1559–1565, as mentioned on p. 4 of the specification.

"Reduction of Ohmic Contact Resistance on n–type 6H–SiC by Heavy Doping" (Uemoto), dated Dec. 6, 1994, vol. 34, pp. L7–L9, as mentioned on p. 4 of the specification.

* cited by examiner

SEMICONDUCTOR CONFIGURATION WITH OHMIC CONTACT-CONNECTION AND METHOD FOR CONTACT-CONNECTING A SEMICONDUCTOR CONFIGURATION

CROSS-REFERENCE TO RELATED APPLICATION

This application is a continuation of copending International Application No. PCT/DE99/01659, filed Jun. 7, 1999, which designated the United States.

BACKGROUND OF THE INVENTION

Field of the Invention

The invention relates to a semiconductor configuration with ohmic contact-connection, as well as to a method for contact-connecting a semiconductor configuration.

The invention relates, in particular, to a semiconductor configuration of the above-mentioned type which includes a predetermined polytype of silicon carbide at least in specific semiconductor regions, in particular semiconductor regions that are contact-connected.

Silicon carbide (SiC) in monocrystalline form is a semiconductor material having outstanding physical properties which make that semiconductor material appear to be of interest particularly for power electronics. That is the case even for applications in the kV range, inter alia due to its high breakdown field strength and its good thermal conductivity. Since the commercial availability of monocrystalline substrate wafers, especially ones made of 6H and 4H silicon carbide polytypes, has risen, silicon carbide-based power semiconductor components, such as e.g. Schottky diodes, are now also receiving more and more attention. Other silicon carbide components which are becoming increasingly widespread are pn diodes and transistors such as, for example, MOSFETs (Metal Oxide Semiconductor Field Effect Transistors).

Stable ohmic contacts to semiconductor regions of different conduction types are indispensable for the functioning of those components. In that case, the lowest possible contact resistances are sought in order to minimize undesirable losses at the semiconductor-metal junction.

An overview paper entitled "Ohmic contacts to SiC" by G. L. Harris et al. from "Properties of Silicon Carbide," ed. by G. L. Harris, INSPEC, 1995, pages 231–234 contains a summary of contact-connection methods for silicon carbide having different polytypes and conduction types. With regard to the contact-connection of n-conducting and p-conducting SiC, the overview paper and the cross-references cited reveal the current state of the art that is generally accepted by experts, as outlined below:

The above-mentioned overview paper only specifies methods in which silicon carbide having only a single conduction type in each case is provided with an ohmic contact.

The contact-connection of n-conducting SiC is accordingly effected through the use of a thin contact layer of a metal or through the use of a layer sequence of different materials. The contact layers are heat-treated at temperatures of between 600° C. and 1100° C. In particular transition metals such as nickel, for example, yield a very good ohmic contact after the thermal treatment on n-conducting, highly doped SiC. That is because at temperatures of around 1000° C., a metal silicide is formed from the transition metal and the silicon contained in the SiC. In comparison therewith, contact techniques for n-conducting SiC which work without a corresponding thermal treatment yield a relatively high contact resistance or a current-voltage characteristic that does not correspond to Ohm's law. Furthermore, the thermal treatment also has a positive effect on the thermal stability of the ohmic contacts being formed.

Aluminum is predominantly used for contact-connecting p-conducting SiC. Since aluminum is readily soluble in SiC and acts as an acceptor, a zone that is highly doped with aluminum can be produced in a boundary region between the aluminum-containing contact region and the semiconductor region made of SiC. In order to avoid evaporation of the aluminum, which melts at a temperature as low as 659° C., during a subsequent thermal treatment, at least one covering layer made of a material having a higher melting point, such as e.g. nickel, tungsten, titanium or tantalum, is applied on the aluminum.

A paper entitled "Thermally stable low ohmic contacts to p-type 6H-SiC using cobalt silicides" by N. Lundberg, M. Östling from Solid-State Electronics, Vol. 39, No. 11, pages 1559–1565, 1996 discloses a method for contact-connecting p-conducting SiC which uses the formation of cobalt silicide ($CoSi_2$). A very low contact resistance can be achieved with the method described and the contact material used.

A paper entitled "Reduction of Ohmic Contact Resistance on n-Type 6H-SiC by Heavy Doping" by T. Uemoto, Japanese Journal of Applied Physics, Vol. 34, 1995, pages L7 to L9 discloses a layer structure being formed of a titanium layer having a thickness of 15 nm and an aluminum layer having a thickness of 150 nm as a possible ohmic contact both on p-conducting and on n-conducting silicon carbide. However, a good contact resistance on the n-conducting semiconductor region is attained only when the dopant concentration in the n-conducting semiconductor region is chosen to be very high. The disclosed dopant concentration of $4.5 \cdot 10^{20}$ cm$^{-3}$ is considerably above the dopant concentrations that are usually used in a silicon carbide semiconductor configuration at the present time. Such a high dopant concentration can only be produced with considerable additional outlay. Thus, during ion implantation, for example, there is the risk of the n-conducting semiconductor region being damaged.

SUMMARY OF THE INVENTION

It is accordingly an object of the invention to provide a semiconductor configuration with ohmic contact-connection and a method for contact-connecting a semiconductor configuration, which overcome the hereinafore-mentioned disadvantages of the heretofore-known devices and methods of this general type and which provide improved contact-connection of n-conducting and p-conducting SiC in comparison with the prior art. In this case, the contacts on the n-conducting and p-conducting semiconductor regions in each case are intended both to have a low contact resistance and to be thermally stable. Moreover, only dopant concentrations which can be produced in a simple manner with currently available technologies are intended to be provided for the n-conducting and p-conducting SiC.

With the foregoing and other objects in view there is provided, in accordance with the invention, a semiconductor configuration with ohmic contact-connection, comprising at least one first semiconductor region made of n-conducting silicon carbide, and at least one second semiconductor region made of p-conducting silicon carbide, the n-conducting and the p-conducting silicon carbide each having a dopant concentration of between $10^{17}$ cm$^{-3}$ and $10^{20}$ cm$^{-3}$; at least one first contact region adjoining the first semiconductor region, and at least one second contact region adjoining the second semiconductor region; the first and second contact regions having an at least approximately identical material composition being practically homogeneous within the respective contact region; and the first and second contact regions formed of a material composed at least of a first and a second material component, the first material component being nickel and the second material component being aluminum.

With the objects of the invention in view, there is also provided a method for contact-connecting a semiconductor configuration, which comprises forming at least one first practically homogeneous contact region on a first semiconductor region made of n-conducting silicon carbide, and forming at least one second practically homogeneous contact region on a second semiconductor region made of p-conducting silicon carbide; applying an at least approximately identical material having a practically homogeneous material composition within each respective contact region for the first and second contact regions; providing each of the first and second semiconductor regions with a dopant concentration of between $10^{17}$ cm$^{-3}$ and $10^{20}$ cm$^{-3}$; and forming the material at least of a first and a second material component, with nickel as the first material component and aluminum as the second material component.

In this case, the invention is based on the insight that, contrary to the customary procedure employed by experts, in which ohmic contact is made with n-conducting and p-conducting silicon carbide having different material in each case, contact-connection of silicon carbide of both conduction types is nevertheless possible with a single material. This results in significant advantages during production since the process steps required for a contact material which differs therefrom are obviated.

It is advantageous for the formation of a good ohmic contact, if the first and second semiconductor regions in each case have a sufficiently high dopant concentration at least at the surface of the semiconductor region. In this case, the dopant concentrations preferably lie between $10^{17}$ cm$^{-3}$ and $10^{20}$ cm$^{-3}$. A particularly good contact results if the dopant concentration is at least $10^{19}$ cm$^{-3}$. These specifications apply both to the n-conduction and to the p-conduction type. These dopant concentrations can be produced without difficulty through the use of ion implantation, for example. In particular, they are also distinctly below the dopant concentration mentioned in the prior art.

What is crucial for the formation of a good ohmic contact resistance both on the n-conducting and on the p-conducting silicon carbide in this case is that the material is not applied to the respective semiconductor regions in the form of a layer structure but rather with a practically homogeneous material composition. If the material is composed of a plurality of material components, such homogeneous material application has the effect that, at the interface with the two semiconductor regions, in each case all of the material components are present directly and can interact with the silicon carbide of the two semiconductor regions. In contrast, in the case of a layer structure, it is necessary first of all to mix together the individual material components which are applied in the form of individual layers having a thickness on the order of magnitude of a few nanometers. In this case, this mixing together (=homogenization) takes place, in particular, at the beginning of a heat-treatment process which is carried out after the material application. However, it is also primarily the aim of such a heat-treatment process to form the ohmic contacts. It is then crucially advantageous if, during this heat-treatment process, all of the relevant material components of the material for the two contact regions are present directly at the interface with the semiconductor regions. This provides significant assistance to the formation of the ohmic contacts.

When the same material is applied to the first and second semiconductor regions, it may be possible, depending on the SiC doping chosen and depending on the material used for the two contact regions, for a slightly mutually deviating material composition to be established in a first boundary region, adjoining the first semiconductor region, of the first contact region and in a second boundary region, adjoining the second semiconductor region, of the second contact region. This slight deviation stems from different exchange processes between the applied material and the first or the second semiconductor region.

If the applied material contains, for example, a material component which acts as a donor or acceptor in silicon carbide, then this material component will migrate to a certain extent into the first or second semiconductor region, where it is bound, for example, as dopant at the corresponding lattice locations. This mixing-together process is critically influenced by the original doping of the first or second semiconductor region and thus proceeds differently in the first and second boundary regions. As a result, the proportion of the relevant material component at least in the first and second boundary regions changes to a mutually different, although very small, extent.

A displacement of the material composition likewise results in the boundary region of the first or second contact region if the material contains a siliciding material component. In this case, silicon originating from the first and second semiconductor regions is mixed together with the material of the first and second contact regions. As a consequence, a silicide based on the material component and the silicon is then formed, inter alia, in the two boundary regions. The degree of doping and the conduction type are critical influencing factors in this process as well, so that this effect can likewise lead to a slightly mutually deviating material composition in the first and second boundary regions.

The above-described interface effects are not manifested in those localized regions of the two contact regions which are remote from the interfaces. Therefore, the material is preserved in its originally applied composition and is thus the same in these regions of the first and second contact regions.

In the case of the teaching according to the invention, all slight differences in the material composition of the first and second contact regions, like those based on the above-described or similar interface effects, are not regarded as critical and are subsumed under the terms "at least approximately identical material composition" and "practically homogeneous".

Moreover, differences in the material composition which are to be attributed to customary, optionally different, contaminants in starting substances are likewise regarded as non-critical in this case.

Furthermore, it is possible within the scope of the teaching according to the invention to apply slightly different material to the first and second semiconductor regions. However, as long as the material compositions deviate from one another by less than 10%, they are likewise designated as "at least approximately identical" herein.

According to one advantageous embodiment, the applied material is composed of at least a first and second material component. In this case, the material may be present in the form of a mixture, a batch, an alloy or a compound of at least these two material components. The first material component advantageously is formed of a material which forms an ohmic contact on n-conducting silicon carbide with a contact resistance $\leq 10^{-1}$ $\Omega$cm$^2$ and preferably $\leq 10^{-3}$ $\Omega$cm$^2$. The second material component, on the other hand, contains at least one element of the third main group of the Periodic Table. The first material component, on one hand, produces a stable ohmic contact on that semiconductor region which is n-conducting. The second material component, on the other hand, produces a stable ohmic contact on the p-conducting semiconductor region.

In accordance with another feature of the invention, the second material component is present in a proportion by volume of from 0.1 to 50% in the material. A proportion of from 0.5 to 20% is preferred in this case.

As stated above, an embodiment in which the first material component at least contains nickel and the second material component at least contains aluminum is advantageous. An advantageous embodiment in which the material exclusively is formed of nickel and aluminum is distinguished, due to the nickel, by a good ohmic contact on the n-conducting semiconductor region. The admixture of aluminum with the nickel in the above-specified concentration range does not impair, or only slightly impairs, the contact resistance on the n-conducting semiconductor region. Moreover, the proportion of nickel in the material also prevents the formation of liquid aluminum islands and a resulting undesirable evaporation of aluminum during the heat-treatment process which is advantageously carried out for the purpose of forming the ohmic contact.

As an alternative to nickel, it is also possible, on one hand, to use one of the elements tantalum, titanium, tungsten, molybdenum, chromium, cobalt, iron or another transition metal and compounds of these elements as the first material component. The second material component, on the other hand, may also contain other elements of the third main group of the Periodic Table instead of aluminum, such as boron, gallium, indium or thallium. Other preferred materials for the contact-connection are thus composed of tantalum or tungsten as the first material component and of boron or gallium as the second material component.

Advantageous embodiments of the method, which emerge from the corresponding subclaims, have essentially the same advantages as the above-mentioned respectively corresponding developments of the semiconductor configuration itself.

Other embodiments of the method relate to the application of the material to the first and second semiconductor regions.

In accordance with another mode of the invention, the first and second contact regions are produced simultaneously, which is particularly advantageous. This considerably reduces the number of process steps required in comparison with successive application. Shorter production cycles can thus be achieved.

In accordance with a further mode of the invention, the material which is applied to the two semiconductor regions is taken from at least two separate sources. In this case, the sources each contain at least one material component, in particular the first or the second material component. They are taken by simultaneous vaporization or sputtering. The two contact regions are subsequently formed by depositing the material components on the first and second semiconductor regions. In this case, the material for the two contact regions is produced either while still in the vapor phase from the individual material components, in the course of the deposition process, or only thereafter. The process parameters can ensure adherence to a specific intended mixture ratio.

In accordance with an added mode of the invention, in contrast, a source material is firstly prepared from the first and second material components and then sputtered in a second method step. The released particles of the material form the two contact regions on the n-conducting and p-conducting silicon carbide, as in the previously described embodiment.

In accordance with an additional mode of the invention, the first and second material components are alternately applied in thin layers to the two semiconductor regions. This can be done by sputtering from two separate sources, so that alternately in a short time sequence, in each case only one of the two material components from the associated source is sputtered and deposited as a thin layer on the two semiconductor regions. The resulting thin layers have, in particular, only a thickness on the order of magnitude of a few Ångstroms. In the extreme case, such a thin layer may also be formed just of a single atomic layer, a so-called monolayer. Due to the small layer thickness and the short time sequence in the course of the layer deposition, this material application of the two material components is also designated as being simultaneous herein. Mixing together of the atoms of these monolayers (homogenization) then already takes place, depending on the process conditions, at least in part during the application process itself or right at the beginning of the subsequent heat-treatment process. Due to the small layer thicknesses, this mixing-together process only lasts a very short time.

In accordance with yet another mode of the invention, the semiconductor configuration is subjected to a brief heat-treatment process after the two contact regions have been applied. In this case, the semiconductor configuration is preferably heated to a maximum temperature of at least 500° C., in particular of about 1000° C., and then held at about this maximum temperature for up to 2 hours, in particular for 2 minutes. However, the heat-treatment process may also be formed only of a heating phase and an immediately following cooling phase, without a hold time at a maximum temperature being provided in between. This process serves for forming the two contact regions. It has been found that thermally stable contacts with good ohmic characteristics and a low contact resistance result both on the first and on the second semiconductor region, that is to say on n-conducting and p-conducting SiC, after this heat-treatment process.

In accordance with yet a further mode of the invention, the first and second contact regions are disposed on a common layer surface or on different layer surfaces. The above-described development possibilities and advantages of the contact-connection of n-conducting and p-conducting SiC with the same material apply analogously to both embodiments.

In accordance with a concomitant mode of the invention, the two contact regions are formed in such a way that they are contiguous or else separate. In this case, the two contact regions can be separated either as early as during the application of the material, by a corresponding mask technique, or afterwards by the removal of excessively applied material. Customary technologies such as etching, for example, may be considered for the latter process.

The two semiconductor regions that are to be contact-connected may be formed of different SiC polytypes. There are embodiments in which SiC in the form of 6H, 4H, 15R or 3C SiC is used for the two semiconductor regions. However, other polytypes are likewise possible.

Outside the first and second semiconductor regions, the semiconductor configuration may also be formed of a material other than SiC. Therefore, one embodiment provides at least one further semiconductor region, for example a substrate, made of a different material than SiC, for example made of silicon (Si), gallium arsenide (GaAs) or gallium nitride (GaN). This substrate is then integrated at least with the first and second semiconductor regions made of SiC to form a hybrid semiconductor configuration.

In one embodiment of the semiconductor configuration, the first and second contact regions are each situated at a freely accessible surface of the semiconductor configuration. This is not absolutely necessary, however. In other developments, the first and second contact regions may also be covered by layers applied in process steps that follow the contact-connection.

Other features which are considered as characteristic for the invention are set forth in the appended claims.

Although the invention is illustrated and described herein as embodied in a semiconductor configuration with ohmic contact-connection and a method for contact-connecting a semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
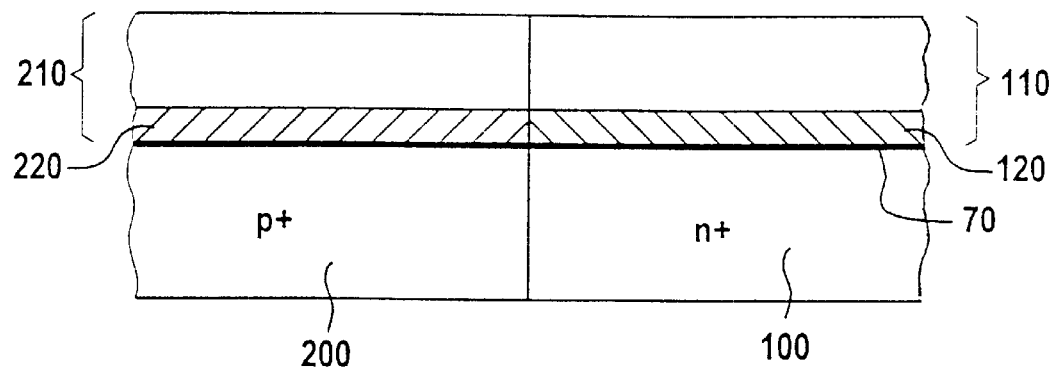
FIG. 1 is a fragmentary, diagrammatic, sectional view of a semiconductor configuration having two contiguous contact regions.

Referring now in detail to the figures of the drawings, in which mutually corresponding parts are provided with the same reference symbols, and first, particularly, to FIG. 1 thereof, there is seen a semiconductor configuration in which a first contact region 110 and a second contact region 210 extend as a contiguous layer over a first semiconductor region 100 and a second semiconductor region 200 adjacent the latter. The first and second semiconductor regions 100 and 200 are each formed of 6H silicon carbide. The first and second semiconductor regions 100 and 200 have a common layer surface 70, on which the first and second contact regions 110 and 210 are disposed.

The first semiconductor region 100 is doped with a high proportion of donors, with nitrogen in the present case, and is thus n-conducting. In contrast, the second semiconductor region 200 has a high dopant concentration of aluminum. Aluminum constitutes an acceptor in silicon carbide, so that the second semiconductor region is consequently p-conducting. The donors and acceptors are introduced into the respective first and second semiconductor regions 100 and 200 through the use of ion implantation. The dopant concentrations in the first and second semiconductor regions 100 and 200 are $10^{19}$ cm$^{-3}$ in each case. These high dopant concentrations are indicated by symbols n$^+$ and p$^+$ in FIG. 1.

The first and second contact regions 110 and 210 are situated on the first and second semiconductor regions 100 and 200 for a thermally stable ohmic contact-connection. The two contact regions 110 and 210 are formed of the same material, which is composed of a first and a second material component in the present case. The first material component is nickel, and the second is aluminum. The proportion by volume is about 10% for aluminum.

The material for the first and second contact regions 110 and 210 is produced by vaporization from separate non-illustrated nickel and aluminum sources. The first and second contact regions 110 and 210 are subsequently formed by depositing gaseous material on the first and second semiconductor regions 100 and 200. In order to form ohmic, thermally stable contacts, the semiconductor configuration of FIG. 1 is subsequently subjected to a heat-treatment process lasting approximately 2 minutes at about 1000° C. After this, a contact resistance of less than $10^{-4}$ Ωcm$^2$ results between the first semiconductor region 100 (n-conducting) and the first contact region 110 and a contact resistance of less than $10^{-3}$ Ωcm$^2$ results between the second semiconductor region 200 (p-conducting) and the second contact region 210.

Boundary regions of the first and second contact regions 110 and 210 are respectively indicated by reference symbols 120 and 220 in FIG. 1. Slight variations in the composition of the material originally applied in the first and second contact regions 110 and 210 result within these boundary regions 120 and 220 due to exchange processes between the first semiconductor region 100 and the first contact region 110 as well as between the second semiconductor region 200 and the second contact region 210. Apart from the resulting slight differences in the material composition of the first and second boundary regions 120 and 220, the first and second contact regions 110 and 210 have the same material composition. It is likewise possible for the boundary regions 120 and 220 in which the exchange processes take place to also extend right into the respective semiconductor regions 100 and 200. However, this case is not illustrated in FIG. 1.

Figure 2:
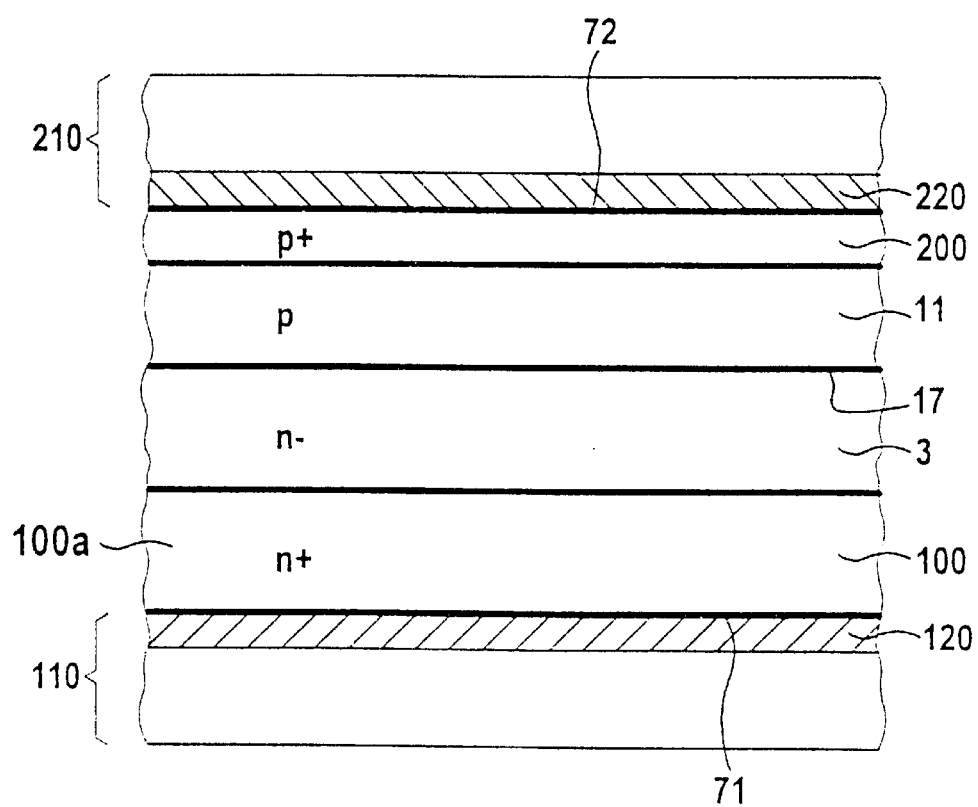
FIG. 2 is a fragmentary, sectional view of a semiconductor configuration having two separate contact regions.

FIG. 2 shows a semiconductor configuration in a layer sequence with the first contact region 110 as the bottommost layer, the second contact region 210 as the topmost layer and a plurality of intervening SiC layers. The first and second contact regions 110 and 210 once again have the respective first and second boundary regions 120 and 220 adjoining the respective adjacent SiC layer. A partial stack of the SiC layers is composed, in ascending order, of the first semiconductor region 100, an n$^-$-type SiC layer 3, a p-type SiC layer 11 and the second semiconductor region 200. In this case, the first contact region 110 is disposed on a first layer surface 71 of the first semiconductor region 100 which, at the same time, also forms a lower main surface of the partial stack of the SiC layers. The second contact region 210 is disposed on a second layer surface 72 of the second semiconductor region 200 which, at the same time, forms an upper main surface of the partial stack of the SiC layers.

The first semiconductor region 100, which may also constitute an SiC substrate 100a in the exemplary embodiment of FIG. 2, again has a high n-type conductivity, whereas the second semiconductor region 200 has a high p-type conductivity. The dopants and materials provided in the first and second semiconductor regions 100 and 200 and in the first and second contact regions 110 and 210 correspond to those of the exemplary embodiment of FIG. 1. This analogy also applies to the method for applying the first and second contact regions 110 and 210.

The semiconductor configuration of FIG. 2 has a pn junction 17 between the n⁻-type SiC layer 3 and the p-type layer 11. The pn junction 17 essentially determines the function of this semiconductor configuration. Such a pn junction 17 may either be part of a larger circuit configuration or may constitute a separate component in the form of a pn diode. Both cases require an ohmic contact-connection of semiconductor regions of different conduction types through the use of the contact regions 110 and 210.

The embodiment shown in FIG. 2 is an example of a semiconductor configuration having first and second contact regions 110 and 210 on different layer surfaces 71 and 72 of the semiconductor configuration.

Figure 3:
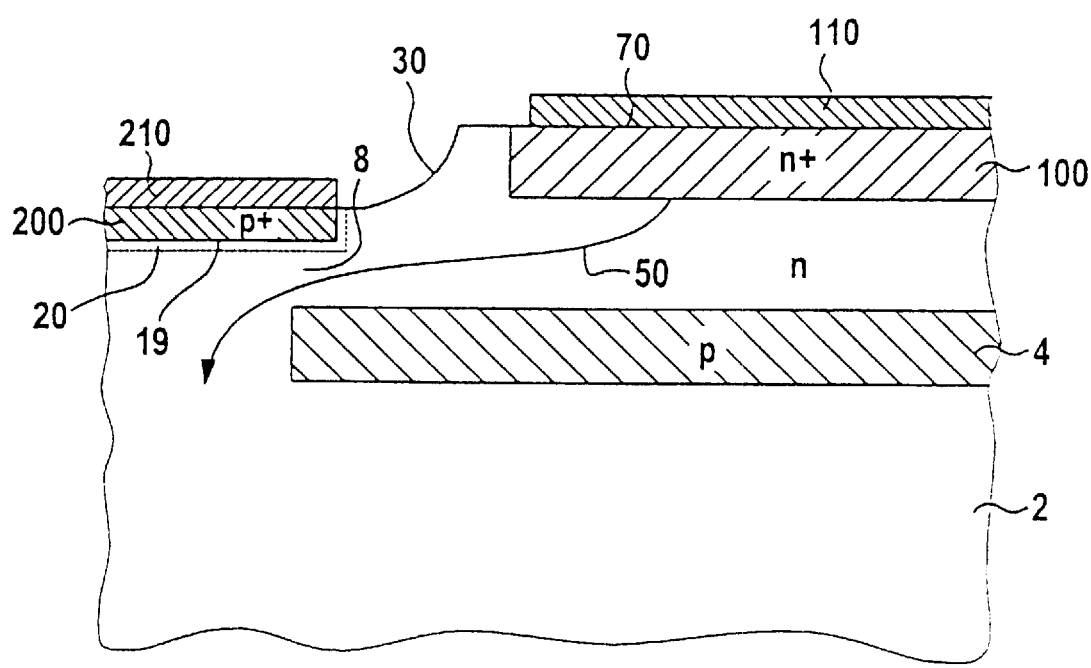
FIG. 3 is a fragmentary, sectional view of a further semiconductor configuration having two separate contact regions.

FIG. 3 illustrates a semiconductor configuration in which the first and second contact regions 110 and 210 are disposed on the common layer surface 70 of the semiconductor configuration. However, in contrast to the exemplary embodiment of FIG. 1, the first and second contact regions 110 and 210 are spatially separate from one another.

The function of the semiconductor configuration of FIG. 3 resides in controlling a current flow 50, which proceeds from the first semiconductor region 100 or from the first contact region 110 and runs through an n-type SiC layer 2. The current flow 50 runs within a channel region 8 of this n-type SiC layer 2. To that end, the dimensions and thus the resistance of the channel region 8 can be altered by the second semiconductor region 200 and a p-type island 4 buried in the n-type SiC layer 2. This is done by the application of a voltage to the second contact region 210, as a result of which a depletion zone 20 at a pn junction 19 between the n-type SiC layer 2 and the p-conducting second semiconductor region 200 propagates, inter alia, into the channel region 8. The dimension of the channel region 8 is additionally preset by providing a depression 30 in which the second semiconductor region 200 is situated.

Both the n-conducting first semiconductor region 100 and the p-conducting second semiconductor region 200 require an ohmic contact-connection in the form of the first and second contact regions 110 and 210 for the above-described functioning.

The first semiconductor region 100 has n-type doping with the donor phosphorus and the second semiconductor region 200 has p-type doping with the acceptor boron. The dopant concentration is $10^{19}$ cm$^{-3}$ in each case. In the exemplary embodiment of FIG. 3, the material which serves for the first and second contact regions 110 and 210 is a material mixture which is composed of a first material component tungsten and a second material component gallium. In this case, the proportion by volume of gallium is about 5%. The application of the material mixture and the subsequent heat-treatment process are effected in the manner already described in connection with FIGS. 1 and 2.

Figure 4:
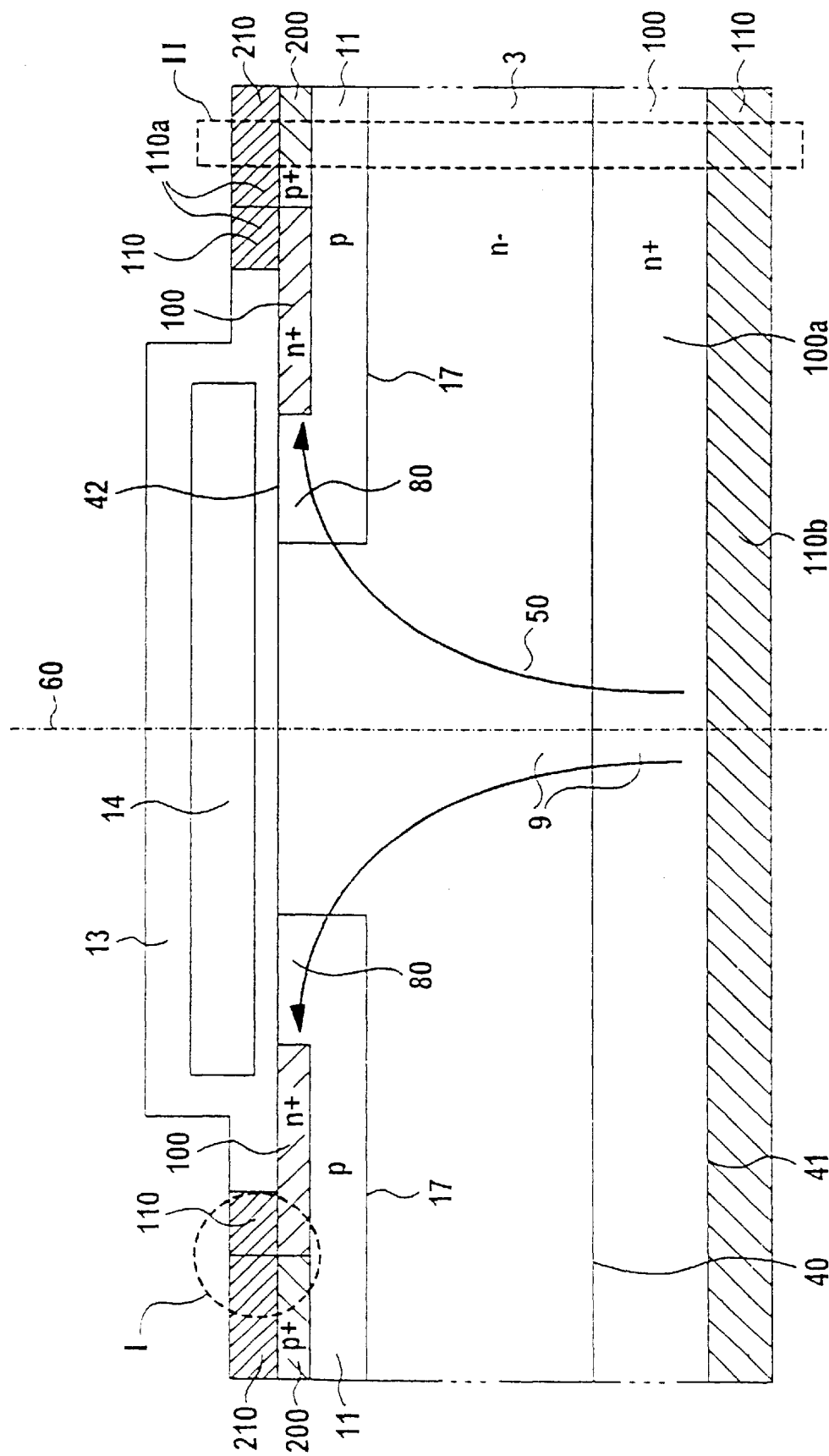
FIG. 4 is a sectional view of a semiconductor configuration in the form of a vertical MOSFET using the semiconductor configurations of FIGS. 1 and 2.

FIG. 4 shows a semiconductor configuration in the form of a vertical MOSFET based on silicon carbide. In this case, the MOSFET includes a plurality of first and second semiconductor regions 100 and 200. The semiconductor configurations shown in FIGS. 1 and 2 are found again as partial structures in the MOSFET of FIG. 4. The partial structures are respectively identified by a broken circle I and a broken rectangle II.

The vertical MOSFET of FIG. 4 is mirror-symmetrical with respect to a plane of symmetry 60. Analogously to FIG. 2, the first semiconductor region 100 lying right at the bottom of the illustrated layer sequence is also designated as a substrate 100a in connection with FIG. 4. The substrate 100a has a surface 40 directed perpendicularly to the plane of symmetry 60. The n⁻-type SiC layer 3 is disposed on that surface 40. Within this n⁻-type SiC layer 3, two separate p-type layers 11, disposed mirror-symmetrically with respect to the plane of symmetry 60, are situated at a surface 42 remote from the SiC substrate 100a. For their part, these layers 11 each include a first and a second semiconductor region 100 and 200, which adjoin one another. The first and second semiconductor regions 100 and 200 are electrically contact-connected by the first and second contact regions 110 and 210, which are contiguous in this case. The contiguous first and second contact regions 110 and 210 may also be regarded as a source electrode 110a in the exemplary embodiment illustrated in FIG. 4. A further first contact region 110 is situated on a surface 41 of the SiC substrate 100a which is remote from the n⁻-type SiC layer 3. The further first contact region 110 may also be regarded as a drain electrode 110b in this case.

In a similar manner to the exemplary embodiment disclosed in FIG. 3, the functioning of the vertical MOSFET of FIG. 4 resides in controlling the current flow 50 between the drain electrode 110b and the source electrode 110a. In this case, the current flow 50 runs through a vertical drift region 9 in the SiC substrate 100a and in the n⁻-type SiC layer 3 as well as a lateral channel region 80 in the p-type layer 11. The resistance of the channel region 80 can be set by way of a gate electrode 14. An electrically insulating oxide layer 13 isolates the gate electrode 14 from the channel region 80 in the p-type layer 11.

As is demonstrated by the exemplary embodiment of the MOSFET, an electrical contact-connection of first and second semiconductor regions 100 and 200 with different conduction types is often required precisely in more complex semiconductor configurations as well. The contact-connection in this case is effected in the manner already described with regard to the examples of FIGS. 1 to 3.

In an embodiment that is not illustrated, a plurality of the semiconductor configurations shown in FIGS. 1 to 4 are part of a complex semiconductor configuration. That configuration consequently includes a multiplicity of first and second semiconductor regions 100 and 200 together with the contact-connection through the associated first and second contact regions 110 and 210.

We claim:

1. A semiconductor configuration with ohmic contact-connection, comprising:
   a) a first semiconductor region made of n-conducting silicon carbide, and a second semiconductor region made of p-conducting silicon carbide, said n-conducting and said p-conducting silicon carbide each having a dopant concentration of between $10^{17}$ cm$^{-3}$ and $10^{20}$ cm$^{-3}$;
   b) a first contact region adjoining said first semiconductor region, and a second contact region adjoining said second semiconductor region;
   c) said first and second contact regions having an at least approximately identical material composition being practically homogeneous within said respective contact region; and
   d) said first and second contact regions formed of a material composed at least of a first and a second material component, said first material component being nickel and said second material component being aluminum.

2. The semiconductor configuration according to claim 1, wherein said first and second contact regions are disposed on a common layer surface.

3. The semiconductor configuration according to claim 1, wherein said first and second contact regions are disposed on different layer surfaces.

4. The semiconductor configuration according to claim 1, wherein said first and second contact regions are contiguous.

5. The semiconductor configuration according to claim 1, wherein said first and second contact regions are separate.

6. The semiconductor configuration according to claim 1, wherein said second material component is present in said material in a proportion by volume of from 0.1% to 50%.

7. The semiconductor configuration according to claim 1, wherein said second material component is present in said material in a proportion by volume of from 0.5% to 20%.

8. A method for contact-connecting a semiconductor configuration, which comprises:

forming a first contact region on a first semiconductor region made of n-conducting silicon carbide, and forming a second contact region on a second semiconductor region made of p-conducting silicon carbide, and thereby forming the first and second contact regions with an at least approximately identical material composition being practically homogeneous within the respective contact region;

providing each of the first and second semiconductor regions with a dopant concentration of between $10^{17}$ $cm^{-3}$ and $10^{20}$ $cm^{-3}$; and forming the first and second contact regions with a material composed at least of a first and a second material component, with nickel as the first material component and aluminum as the second material component.

9. The method according to claim 8, which further comprises simultaneously applying the first and second contact regions to the first and second semiconductor regions.

10. The method according to claim 8, which further comprises providing a proportion by volume of the second material component of from 0.1% to 50% in the material.

11. The method according to claim 8, which further comprises providing a proportion by volume of the second material component of from 0.5% to 20% in the material.

12. The method according to claim 8, which further comprises applying the material by simultaneous vaporization from two separate sources of the first and second material components.

13. The method according to claim 8, which further comprises applying the material by simultaneous sputtering from two separate sources of the first and second material components.

14. The method according to claim 8, which further comprises preparing a source material in advance from the first and second material components and then applying the material by sputtering the source material.

15. The method according to claim 8, which further comprises subjecting the semiconductor configuration including the first and second semiconductor regions and the applied first and second contact regions to a heat-treatment process with heating to a maximum temperature of at least 500° C.

16. The method according to claim 8, which further comprises subjecting the semiconductor configuration including the first and second semiconductor regions and the applied first and second contact regions to a heat-treatment process with heating to a maximum temperature of about 1000° C.

17. The method according to claim 15, which further comprises maintaining the maximum temperature constant for a duration of at most 2 hours.

18. The method according to claim 15, which further comprises maintaining the maximum temperature constant for a duration of at most 2 minutes.

19. The method according to claim 16, which further comprises maintaining the maximum temperature constant for a duration of at most 2 hours.

20. The method according to claim 16, which further comprises maintaining the maximum temperature constant for a duration of at most 2 minutes.

21. The method according to claim 8, which further comprises applying the material by alternately applying thin layers of the first and second material components.

* * * * *